(12) United States Patent
Zhang (10) Patent No.: US 11,164,913 B2
(45) Date of Patent: Nov. 2, 2021

(54) DISPLAY PANEL AND DISPLAY APPARATUS

(71) Applicant: BOE TECHNOLOGY GROUP CO., LTD., Beijing (CN)

(72) Inventor: Hao Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 29 days.

(21) Appl. No.: 16/616,167

(22) PCT Filed: Apr. 22, 2019

(86) PCT No.: PCT/CN2019/083685
§ 371 (c)(1),
(2) Date: Nov. 22, 2019

(87) PCT Pub. No.: WO2019/206079
PCT Pub. Date: Oct. 31, 2019

(65) Prior Publication Data
US 2020/0212135 A1 Jul. 2, 2020

(30) Foreign Application Priority Data
Apr. 23, 2018 (CN) .......................... 201810368340.8

(51) Int. Cl.
*H01L 27/32* (2006.01)
*G09G 3/3258* (2016.01)

(52) U.S. Cl.
CPC ....... *H01L 27/3225* (2013.01); *G09G 3/3258* (2013.01); *H01L 27/3272* (2013.01); *H01L 27/3276* (2013.01)

(58) Field of Classification Search
CPC .............. G09G 3/3258; G09G 3/3233; H01L 27/3272; H01L 27/3276; H01L 27/3225;
(Continued)

(56) References Cited

U.S. PATENT DOCUMENTS 6,346,717 B1 2/2002 Kawata
10,417,477 B2 * 9/2019 Ko ........................... G02B 6/08
(Continued)

FOREIGN PATENT DOCUMENTS

CN 1287685 A 3/2001
CN 1624556 A 6/2005
(Continued)

OTHER PUBLICATIONS

First Chinese Office Action dated Feb. 23, 2021, received for corresponding Chinese Application No. 201810368340.8, 15 pages.

*Primary Examiner* — Kyoung Lee
*Assistant Examiner* — Christina A Sylvia
(74) *Attorney, Agent, or Firm* — Kinney & Lange, P.A.

(57) ABSTRACT

A display panel and a display apparatus including the display panel are provided. The display panel includes: a first substrate; a light emitting device on the first substrate, the light emitting device being configured to emit light; a light shielding layer on the first substrate, the light shielding layer being configured to shield light, which is emitted from the light emitting device and reflected by a touch body, from being transmitted through the light shielding layer; and at least one light transmitting portion in the light shielding layer, the light transmitting portion being configured to allow the light, which is emitted from the light emitting device and reflected by the touch body, to pass through the light transmitting portion and irradiate onto an optical sensor,
wherein the light shielding layer is electrically connected to a signal terminal for supplying a designated potential signal.

19 Claims, 10 Drawing Sheets

(58) Field of Classification Search
CPC ... H01L 27/323; H01L 27/3234; H01L 27/32; H01L 27/3227
See application file for complete search history.

(56) References Cited

U.S. PATENT DOCUMENTS

| | | |
|---|---|---|
| 2005/0045881 A1 | 3/2005 | Nakamura et al. |
| 2013/0037815 A1 | 2/2013 | Okajima et al. |
| 2014/0339400 A1 | 11/2014 | Maeda et al. |
| 2015/0021571 A1 | 1/2015 | Yamakita |
| 2015/0145808 A1* | 5/2015 | Cho ..................... G06F 3/0443 |
| | | 345/174 |
| 2015/0277172 A1 | 10/2015 | Sekine |
| 2017/0017129 A1 | 1/2017 | Zhao et al. |
| 2018/0089491 A1* | 3/2018 | Kim .................. G06K 9/00912 |

FOREIGN PATENT DOCUMENTS

| | | |
|---|---|---|
| CN | 102859693 A | 1/2013 |
| CN | 103959363 A | 7/2014 |
| CN | 104952404 A | 9/2015 |
| CN | 105093738 A | 11/2015 |
| CN | 105097838 A | 11/2015 |
| CN | 107871447 A | 4/2018 |

\* cited by examiner

DISPLAY PANEL AND DISPLAY APPARATUS

CROSS-REFERENCE TO RELATED APPLICATION

This application is a Section 371 National Stage Application of International Application No. PCT/CN2019/083685, filed on Apr. 22, 2019, entitled "DISPLAY PANEL AND DISPLAY APPARATUS", which claims the benefit of Chinese Patent Application No. 201810368340.8 filed on Apr. 23, 2018 in the National Intellectual Property Administration of China, the whole disclosure of which is incorporated herein by reference.

TECHNICAL FIELD

Embodiments of the present disclosure relate to a field of display technology, and in particular, to a display panel and a display apparatus including the display panel.

BACKGROUND

Due to uniqueness of a fingerprint pattern, a fingerprint recognition may be performed by comparing detailed features of different fingerprints, thereby realizing functions such as identity authentication and privacy protection. As a fingerprint recognition technology is developing, the fingerprint recognition technology is widely used in various terminal apparatus such as display apparatus. For example, the fingerprint recognition technology combined with optical imaging is gradually applied to various terminal apparatus such as display apparatus. Moreover, the display apparatus having a narrow frame is increasingly demanded, so that how to design a display apparatus integrated with fingerprint recognition technology is one of focus issues in the field.

SUMMARY

In an aspect, a display panel is provided, including: a first substrate; a light emitting device on the first substrate, the light emitting device being configured to emit light; a light shielding layer on the first substrate, the light shielding layer being configured to shield light, which is emitted from the light emitting device and reflected by a touch body, from being transmitted through the light shielding layer; and at least one light transmitting portion in the light shielding layer, the light transmitting portion being configured to allow the light, which is emitted from the light emitting device and reflected by the touch body, to pass through the light transmitting portion and irradiate onto an optical sensor, wherein the light shielding layer is electrically connected to a signal terminal for supplying a designated potential signal.

Optionally, the display panel includes a display area and a non-display area, the display panel further includes a signal access terminal in the non-display area, and the signal terminal for supplying the designated potential signal includes the signal access terminal.

Optionally, the display panel further includes a pixel driving circuit, the pixel driving circuit includes a driving transistor, the light emitting device includes a first electrode, a second electrode, and a light emitting layer between the first electrode and the second electrode, the driving transistor includes a gate electrode, a source electrode and a drain electrode, the drain electrode is electrically connected to a first potential signal line, and the source electrode is electrically connected to the first electrode of the light emitting device, and the second electrode of the light emitting device is electrically connected to a second potential signal line; and wherein the signal terminal for supplying the designated potential signal includes at least one of the first potential signal line, the source electrode of the driving transistor or the second potential signal line.

Optionally, the signal access terminal supplies the designated potential signal, the signal access terminal is located in the same layer as the light shielding layer, and the light shielding layer is electrically connected to the signal access terminal through a first electrical connection line.

Optionally, an orthographic projection of the first potential signal line on the first substrate overlaps with an orthographic projection of the light shielding layer on the first substrate, and the first potential signal line is located on a side of the light shielding layer distal to the first substrate.

Optionally, the display panel further includes: a first insulating layer between the light shielding layer and a layer where the first potential signal line is located; and a first electrical connection member in the first insulating layer, and the light shielding layer is electrically connected to the first potential signal line through the first electrical connection member.

Optionally, an orthographic projection of the first electrical connection member on the first substrate falls within the orthographic projection of the light shielding layer on the first substrate, and the orthographic projection of the first electrical connection member on the first substrate overlaps with the orthographic projection of the first potential signal line on the first substrate.

Optionally, an orthographic projection of the source electrode on the first substrate falls within an orthographic projection of the light shielding layer on the first substrate, and the source electrode is located on a side of the light shielding layer distal to the first substrate.

Optionally, the display panel further includes: a second insulating layer between the light shielding layer and a layer where the source electrode is located; and a second electrical connection member in the second insulating layer, and the light shielding layer is electrically connected to the source electrode through the second electrical connection member.

Optionally, an orthographic projection of the second electrical connection member on the first substrate falls within the orthographic projection of the light shielding layer on the first substrate, and the orthographic projection of the second electrical connection member on the first substrate overlaps with the orthographic projection of the source electrode on the first substrate.

Optionally, an orthographic projection of the second potential signal line on the first substrate does not overlap with an orthographic projection of the light shielding layer on the first substrate.

Optionally, the display panel further includes: a third insulating layer between the light shielding layer and a layer where the second potential signal line is located; a third electrical connection member in the third insulating layer; and a second electrical connection line located in the same layer as the light shielding layer, and the light shielding layer is electrically connected to the second potential signal line through both the third electrical connection member and the second electrical connection line.

Optionally, the first potential signal line and the second potential signal line are located in the same layer.

Optionally, the first potential signal line supplies an ELVDD signal, and the second potential signal line supplies an ELVSS signal.

Optionally, an orthographic projection of the light shielding layer on the first substrate falls into the display area.

Optionally, an orthographic projection of a combination of the light shielding layer and the at least one light transmitting portion on the first substrate coincides with the display area.

Optionally, the light transmitting portion includes a transparent material, or the light transmitting portion includes a light transmitting hole.

Optionally, the display panel further includes at least one optical sensor, wherein the at least one optical sensor is disposed on a side of the light shielding layer distal to the light emitting device, and the at least one optical sensor is configured to receive the light passing through the light transmitting portion.

Optionally, the display panel includes a plurality of light transmitting portions and a plurality of optical sensors, and orthographic projections of the plurality of light transmitting portions on the first substrate fall within orthographic projections of the plurality of optical sensors on the first substrate, respectively.

Optionally, an orthographic projection of the first electrical connection member on the first substrate does not overlap with an orthographic projection of the light transmitting portion on the first substrate.

Optionally, an orthographic projection of the second electrical connection member on the first substrate does not overlap with an orthographic projection of the light transmitting portion on the first substrate.

In another aspect, a display apparatus is provided, including the display panel as described above.

BRIEF DESCRIPTION OF THE DRAWINGS

The above and/or additional aspects and advantages of the present disclosure will become apparent and readily understood from the following embodiments with reference to accompanying drawings, in which.

DETAILED DESCRIPTION OF EMBODIMENTS

Exemplary embodiments will be described below with reference to the accompanying drawings, however, these embodiments may be embodied in different forms and should not be construed as being limited to the implementations described herein. Instead, the implementations are provided so as to make the present disclosure be thorough and complete, and the exemplary embodiments will be fully conveyed to those skilled in the art. The implementations or parts thereof may be combined to form other embodiments.

It is to be understood by those skilled in the art that all terms (including technical and scientific terms) used herein have the same meaning as commonly understood by those skilled in the art, unless otherwise defined. It should also be understood that terms such as those defined in a general dictionary should be understood to have meaning consistent with the meaning in the context of the related art, and will not be explained in an idealized or excessively formal meaning, unless specifically defined here.

In the drawings, dimensions of layers or regions may be exaggerated for clarity of illustration. It will also be understood that when a layer or an element is referred to as being "on/above" another layer or another substrate, it may be directly "on/above" another layer or another substrate, or there may be an intermediate layer therebetween. Moreover, it will be understood that when a layer is referred to as being "under/below" another layer, it may be directly under/below another layer, or there may be one or more intermediate layers therebetween. In addition, it will be understood that when a layer is referred to as being "between" two layers, it may be the only layer between the two layers, or there may also be one or more intermediate layers. Throughout the specification, the same reference numerals refer to the same elements.

Unless otherwise defined, technical terms or scientific terms used in the present disclosure should be understood in the ordinary meaning understood by those skilled in the art. The words "first," "second," and similar terms used in the present disclosure do not denote any order, quantity, or importance, but are used to distinguish different components. Similarly, the words "a", "an", "the" or the like do not denote a quantity limitation, but mean that there may be at least one element following the words. The words "include", "including", "comprise", "comprising" or the like mean that element or item preceding the words is intended to encompass elements or items following the words and equivalents thereof, and does not exclude other element or items. The words "upper", "lower", "left", "right", or the like are only used to indicate relative positional relationships, and when an absolute position of an object to be described is changed, the relative positional relationships may also change accordingly. It is to be understood that the word "comprise" or "comprising" used herein means that there may be features, integers, steps, operations, components and/or groups, but it does not exclude that there may be one or more other features, integers, steps, operations, components and/or groups thereof, or one or more other features, integers, steps, operations, components and/or groups thereof may be added. It will be understood that an expression that an element is "connected" or "connected" to another element may mean that the element may be directly connected or connected to the other element, or there may be other intermediate elements therebetween.

An expression "same layer" as used herein, unless otherwise defined, means that two components, elements or members may be formed by the same one patterning process, and the two components, elements or members may have the same thickness or different thicknesses.

For example, the narrow-frame display technology has gradually become the mainstream. One means for realizing this technology is to integrate a sensing circuit having fingerprint recognition function into a back panel design of a screen so as to realize the in-screen fingerprint recognition, thereby improving an area of a display area of the display screen. In one technique for realizing the in-screen fingerprint recognition function, the pinhole imaging is combined with a photosensitive circuit to perform the fingerprint recognition. In this technique, a light shielding layer needs to be provided so as to provide a light transmitting hole therein.

Figure 1:
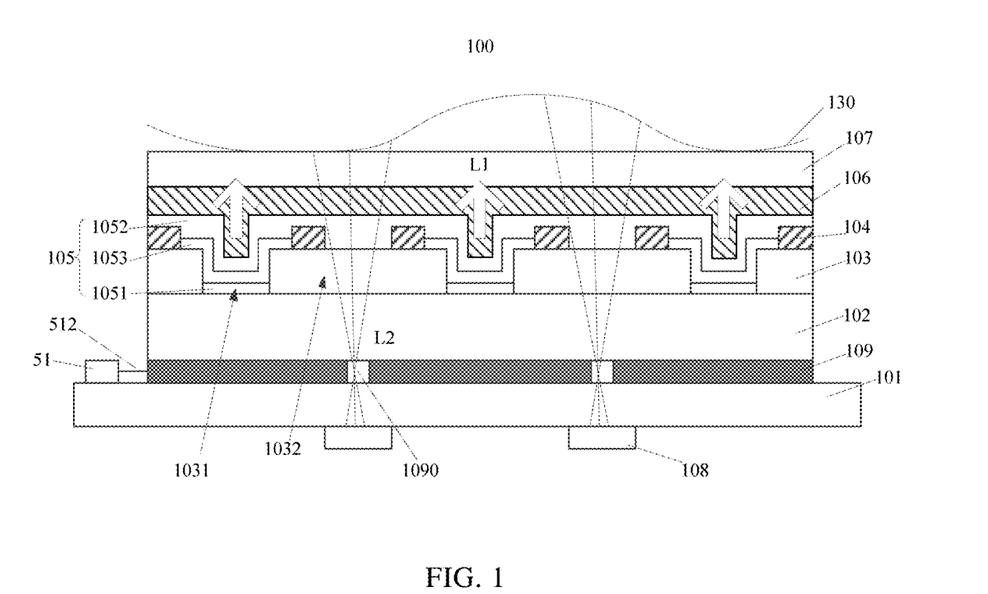
FIG. 1 is a schematic cross-sectional view of a display panel according to some embodiments of the present disclosure, in which a principle of fingerprint recognition using pinhole imaging is shown.

FIG. 1 is a schematic cross-sectional view of a display panel according to some embodiments of the present disclosure, which utilizes the pinhole imaging to perform the fingerprint recognition. For example, the display panel may be an organic light-emitting diode (abbreviated as OLED) display panel. As shown in FIG. 1, the display panel 100 includes a pixel driving circuit layer 102, a pixel defining layer 103, a spacer layer 104, a light emitting device 105, an encapsulation layer 106, and a second substrate 107 which are disposed on a first substrate 101.

The light emitting device 105 may include a first electrode 1051, a second electrode 1052, and an organic light emitting layer 1053 between the first electrode 1051 and the second electrode 1052. The first electrode 1051 is electrically connected to the pixel driving circuit layer 102. A pixel driving circuit, a gate line, a data line, a power supply line, and the like for driving the light emitting device 105 are provided in the pixel driving circuit layer 102. Generally, the pixel driving circuit of each sub-pixel includes a driving transistor, a switching transistor, a capacitor, and the like, and is electrically connected to a gate line, a data line, and a power supply line corresponding to the sub-pixel. Under the control of the pixel driving circuit, the light emitting device 105 may be controlled to emit light, as indicated by a light ray L1 in FIG. 1. It should be noted that, in order to clearly illustrate the principle of the fingerprint recognition by using the pinhole imaging in FIG. 1, a specific structure of the pixel driving circuit is omitted in FIG. 1 and is only schematically illustrated by the pixel driving circuit layer 102. Hereinafter, the pixel driving circuit layer 102 and the pixel driving circuit will be described in more detail.

The pixel defining layer 103 is used to space adjacent organic light emitting layers 1053 to avoid crosstalk. An opening is formed in the pixel defining layer 103 to divide the pixel defining layer 103 into a pixel region (opening region) 1031 and a pixel spacing region 1032. The pixel region 1031 exposes the first electrode 1051 of the light emitting device 105, and the organic light emitting layer 1053 is formed in the pixel region 1031 of the pixel defining layer 103 and on the first electrode 1051.

The spacer layer 104 may be used to support an evaporation mask when the organic light-emitting layer 1053 is formed through vapor-depositing, thereby isolating the pixel defining layer 103 from the evaporation mask to protect the pixel defining layer 103. The spacer layer 104 may also function to further isolate adjacent organic light-emitting layers. A material of the spacer layer 104 is usually a resin material such as polyimide (PI) or the like, or may be an inorganic insulating material such as silicon oxide or the like. The spacer layer 104 generally includes a plurality of spaced-apart spacers, which are generally cuboid, columnar, spherical, hemispherical or of other shapes.

As shown in FIG. 1, a light shielding layer 109 is disposed between the first substrate 101 and the pixel driving circuit layer 102, and the light shielding layer 109 is configured to shield light, which is emitted from the light emitting device 105 and reflected by a touch body 130, from being transmitted therethrough. Optionally, the light shielding layer 109 may be made of a light shielding material, for example, a metal material, to shield the light well.

Further, the display panel 100 includes at least one light transmitting portion 1090 disposed in the light shielding layer 109, and the light transmitting portion 1090 is configured to allow the light, which is emitted from the light emitting device 105 and reflected by the touch body 130 (as indicated by light rays L2 in FIG. 1), to pass through it. Optionally, the light transmitting portion 1090 may be made of a transparent material. Alternatively, the light transmitting portion 1090 may be a light transmitting hole. That is, the light transmitting portion 1090 may be a transparent material portion provided in the light shielding layer 109 or a light transmitting hole provided in the light shielding layer 109. The number of the light transmitting portions 1090 provided in the light shielding layer 109 may be two or more, and the specific number may be flexibly set according to actual needs.

The display panel 100 may also include an optical sensor 108. The optical sensor 108 may be disposed on a side of the light shielding layer 109 distal to the light emitting device 105 to receive the light passing through the light transmitting portion 1090 (as indicated by the light rays L2 in FIG. 1). For example, as shown in FIG. 1, the optical sensor 108 may be disposed on a side of the first substrate 101 distal to the light emitting device 105. However, the embodiments of the present disclosure are not limited thereto, and the optical sensor 108 may also be disposed on a side of the first substrate 101 adjacent to the light emitting device 105 as long as it may receive the light passing through the light transmitting portion 1090. Optionally, as shown in FIG. 1, a plurality of light transmitting portions 1090 may be disposed in the light shielding layer 109, a plurality of optical sensors 108 may be disposed on the first substrate 101, and the plurality of light transmitting portions 1090 may be in one-to-one correspondence with the plurality of optical sensors 108. That is, orthographic projections of the light transmitting portions 1090 on the first substrate 101 overlap with orthographic projections of the optical sensors 108 on the first substrate 101, respectively. For example, the orthographic projections of the light transmitting portions 1090 on the first substrate 101 fall within the orthographic projections of the optical sensors 108 on the first substrate 101, respectively. In this way, it is beneficial for each of the optical sensors 108 to receive the reflected light passing through the corresponding light transmitting portion 1090.

During operation of the display panel 100, for example, under the control of the pixel driving circuit, the light emitting device 105 may be controlled to emit light, as indicated by the light ray L1 in FIG. 1. When the touch body 130 touches the second substrate 107, a part of the light emitted from the light emitting device 105 is reflected by a surface of the touch body 130 (for example, a finger), and the reflected light may be irradiated onto the optical sensor 108 through the light transmitting portion 1090. For example, in a case where the touch body 130 is a finger, fingerprint valleys (recessed surfaces) of the finger and fingerprint ridges (convex surfaces) reflect light in a different way, the light reflected by the finger is detected by the optical sensors 108, and detected data signals are sent to a processing circuit for analysis to obtain an image of the surface of the finger, further the image is used for the fingerprint recognition.

It should be noted that the touch body may include a user's finger, a stylus pen, an operating object having a specified contact surface, and the like. In addition, the shape and size of the light transmitting portion 1090 are not particularly limited. For example, a cross section of the light transmitting portion 1090 in a direction parallel to an upper surface of the first substrate 101 may be in a shape of circle, rectangle, diamond, or the like.

Figure 2A:
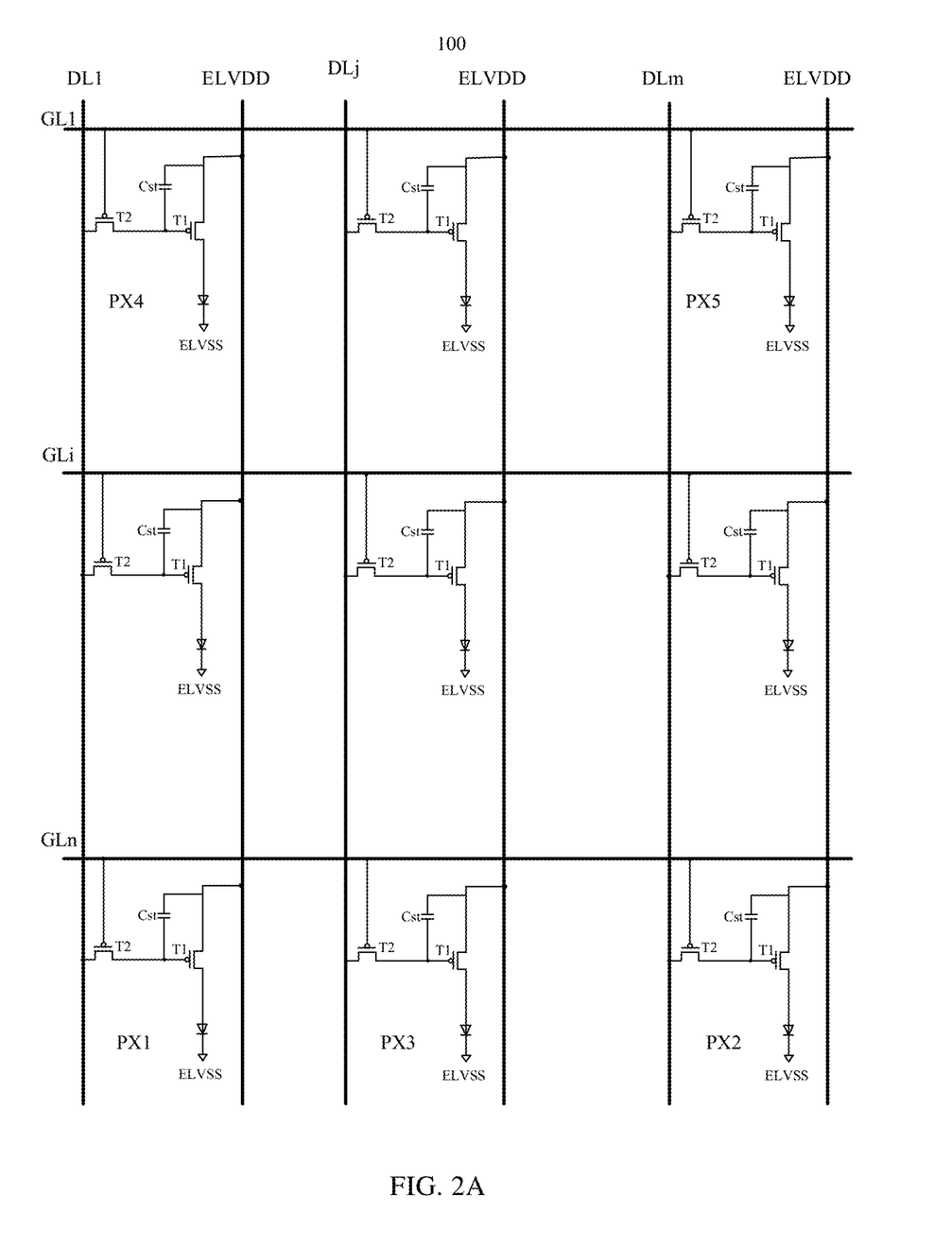
FIG. 2A is a circuit diagram of a display panel according to some embodiments of the present disclosure.
Figure 2B:
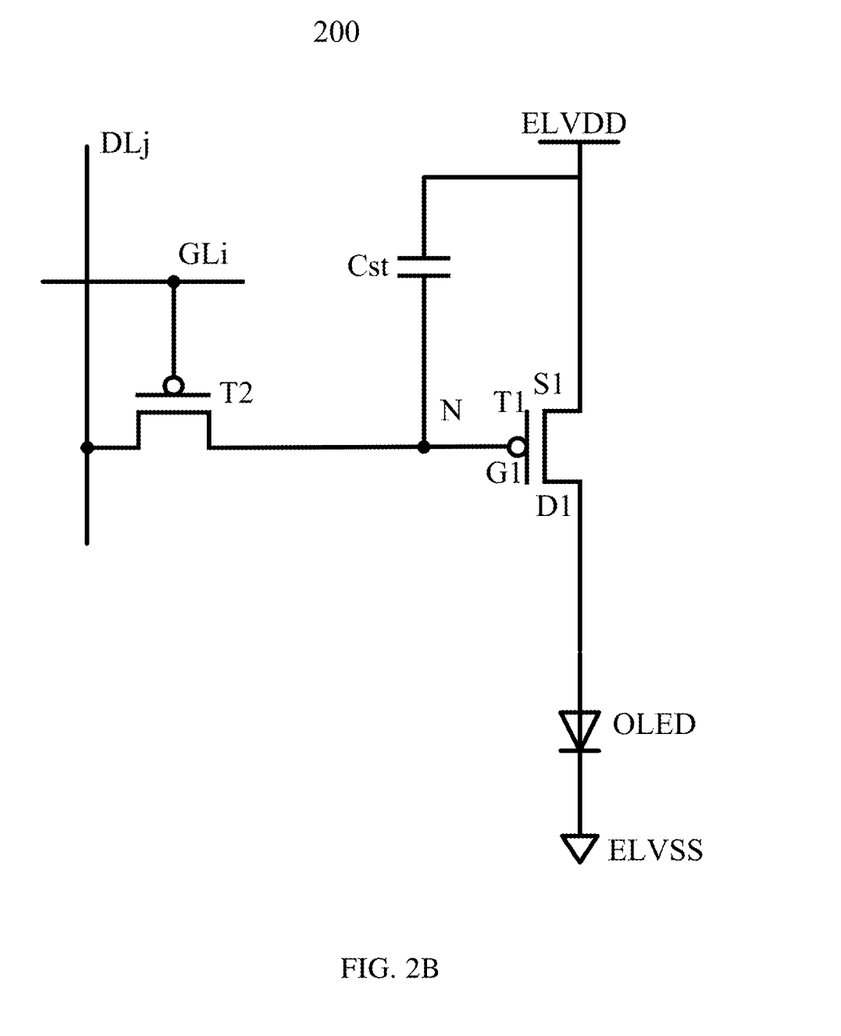
FIG. 2B is an enlarged view of a pixel driving circuit in the circuit diagram shown in FIG. 2A.

FIG. 2A is a circuit diagram of a display panel according to some embodiments of the present disclosure, and FIG. 2B is an enlarged view of a pixel driving circuit of the circuit diagram shown in FIG. 2A. Referring to FIG. 2A and FIG. 2B, the display panel 100 may include n gate lines GL1 to GLn and m data lines DL1 to DLm, so that n×m pixels are formed. Each of the pixels includes a pixel driving circuit. The pixel driving circuit shown in FIG. 2B may be any one of n×m pixel driving circuits, and it is connected to $i^{th}$ gate line GLi and $j^{th}$ data line DLj, wherein 1≤i≤n and 1≤j≤m.

As shown in FIG. 2B, the pixel driving circuit 200 may include a driving transistor T1, a switching transistor T2, and a capacitor Cst, so as to drive an organic light emitting device (for example, an OLED). The driving transistor T1 is connected between an ELVDD power supply line and the light emitting device. The switching transistor T2 is connected between the data line DLj and a gate electrode of the driving transistor T1, and is turned on/off in response to a scan signal transmitted to the gate line GLi. The capacitor Cst is connected between the ELVDD power supply line and the gate electrode of the driving transistor T1.

The inventor has found through research that electric charges are easy to be accumulated on a metal light shielding layer 109 since the light shielding layer 109 is usually made of a metal material. As a result, the metal light shielding layer 109 on which the charges are accumulated may affect performances of the pixel driving circuit (for example, affecting a switching performance of the transistor, or a capacity of the capacitor, or the like), thereby affecting display performance and affecting stability of the fingerprint recognition. In particular, as an electric potential of the metal light shielding layer 109 on which the charges are accumulated is suspended, it may affect the output characteristics of the driving thin film transistor of the pixel, thereby resulting in a kink on an output characteristic curve, that is, resulting in a kink effect.

The so-called kink effect refers to a non-saturation characteristic of a drain current and a drain voltage of the transistor. Specifically, under the action of a high drain voltage, a region near the drain electrode of the transistor appears as a high field region, and electrons located in the high field region acquire sufficient kinetic energy to generate impact ionization, thereby generating a large number of electron-hole pairs. As a result, the holes flow toward the substrate. Since the substrate is not grounded, the holes are accumulated on the substrate to increase an electric potential of the substrate. When sufficient holes are accumulated on the substrate, the substrate-source junction is forward biased, thereby causing a large number of electrons to be emitted from the source electrode and collected by the drain electrode. The increased current will enhance the impact ionization, resulting in positive feedback to regenerate more electron-hole pairs. Thus, carriers near the drain electrode are subject to avalanche multiplication, so that the drain current rapidly increases with the drain voltage.

In the display panel according to some embodiments of the present disclosure, the light shielding layer 109 is made of a conductive material such as metal, and the light shielding layer 109 may be supplied with a designated potential signal to stabilize an electric potential of the light shielding layer 109 at a designated potential, thereby avoiding the electric potential of the light shielding layer 109 from being suspended. Herein, unless otherwise specified, "designated potential signal" refers to as a signal having a fixed potential, which may be a positive potential such as +5V, +8V, +10V or the like, or be a negative potential such as −5V, −8V, −10V or the like. Herein, in order to supply the light shielding layer 109 with the designated potential signal, the light shielding layer 109 may be electrically connected to a signal terminal for supplying the fixed potential. In this way, floating charges on the light shielding layer 109 may be reduced, thereby reducing electrical influence of the floating charges on other circuits of the display panel, for example, reducing or even eliminating the kink effect. Therefore, the output characteristic of the driving transistor in the pixel driving circuit may be effectively improved, which is advantageous for adjusting the characteristic of the driving transistor, thereby improving a display quality and a fingerprint recognition accuracy.

Figure 3:
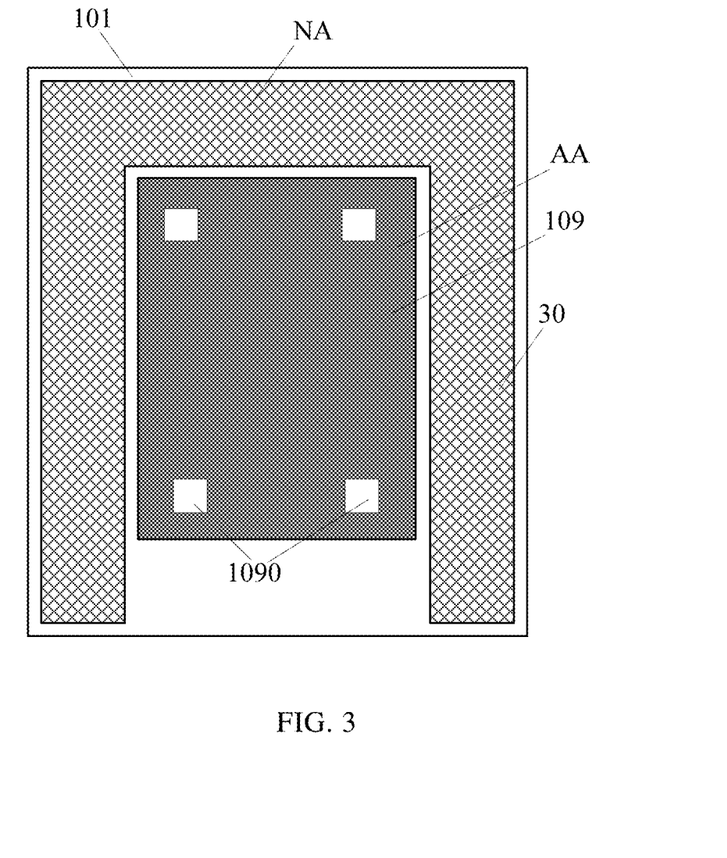
FIG. 3 is a plan view of a display panel according to some embodiments of the present disclosure, in which a first substrate and a light shielding layer are mainly illustrated.

Referring to FIG. 3, a plan view of a display panel according to some embodiments of the present disclosure is schematically illustrated. It should be noted that, in order to clearly show a position of the light shielding layer 109 on the display panel, the plan view mainly shows the first substrate 101 and the light shielding layer 109, while other layers are omitted. As shown in FIG. 3, the display panel includes a display area AA (also referred to as an active area) and a non-display area NA (also referred to as a peripheral area). When the display panel is displayed, information such as images, characters, and the like are displayed on the display area AA. The non-display area NA surrounds the display area AA for arranging structures 30 such as circuits, wirings and the like.

For example, a footprint of the display area AA coincides with a footprint of the light shielding layer 109, that is, an orthographic projection of a combination of the light shielding layer 109 and the light transmitting portions 1090 on the first substrate 101 coincides with an orthographic projection of the display area AA on the first substrate 101. Alternatively, the footprint of the display area AA may be located within the footprint of the light shielding layer 109, or the orthographic projection of the light shielding layer 109 on the first substrate 101 may fall within the orthographic projection of the display area AA on the first substrate 101.

Figure 4:
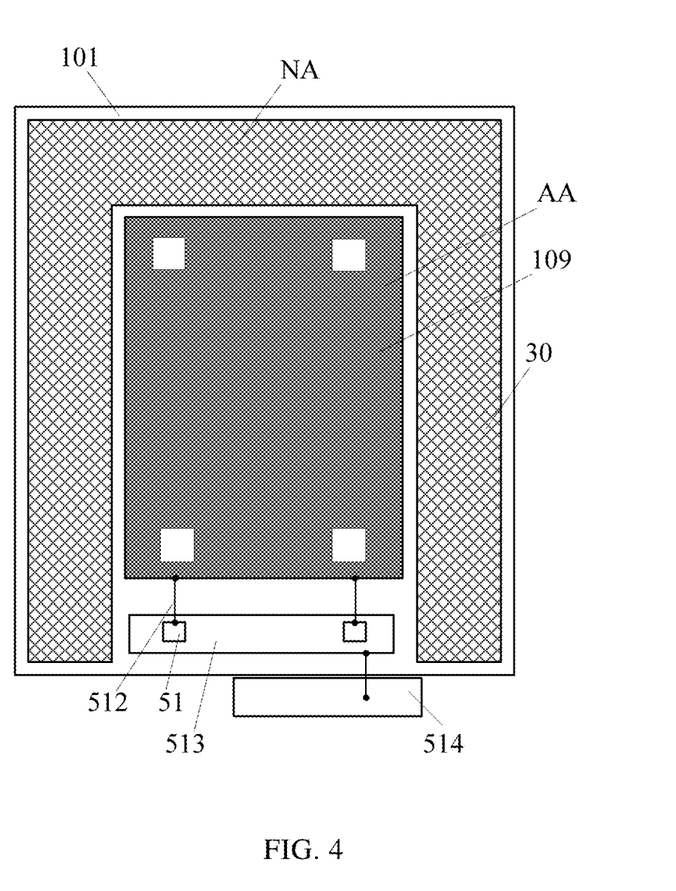
FIG. 4 is a plan view of a display panel according to some embodiments of the present disclosure, which illustrates that a light shielding layer is electrically connected to a signal access terminal.

For example, as shown in FIG. 4, the display panel 100 may further include: a signal access terminal 51 located in the non-display area NA. The light shielding layer 109 may be electrically connected to the signal access terminal 51. For example, the light shielding layer 109 may be electrically connected to the signal access terminal 51 through an electrical connection line 512 (which may also be referred to as a first electrical connection line). Referring back to FIG. 1, the light shielding layer 109 and the signal access terminal 51 may be located in the same layer, and the electrical connection line 512 electrically connects the light shielding layer 109 with the signal access terminal 51 located in the same layer as the light shielding layer 109. Referring to FIG. 4, the signal access terminal 51 may be located in a PAD area 513 of the display panel 100, and the PAD area 513 is electrically connected to a voltage generator 514 for generating the designated potential signal. With such an electrical connection, the voltage generator 514 may generate the designated potential signal and supply it to the light shielding layer 109 through the signal access terminal 51. For example, when the driving transistor T1 is a P-type transistor, the designated potential signal may be a positive potential signal, that is, the voltage generator 514 may generate a designated potential signal of, for example, +5V, and the designated potential signal of +5V may be supplied to the light shielding layer 109 through the signal access terminal 51. In this way, the electric potential of the light shielding layer 109 may be stabilized at the designated potential signal, so that the electrical influence on other circuits of the display panel may be reduced and the output characteristic of the driving transistor may be stabilized.

It should be noted that at least one signal access terminals 51 may be provided. In the illustrated embodiment, two signal access terminals 51 are provided. The at least one signal access terminals 51 provide signals having the same fixed potential. Moreover, the fixed potential of the above designated potential signal may be adjusted according to actual needs, so that the output characteristic of the driving transistor may meet the actual needs better.

Figure 5:
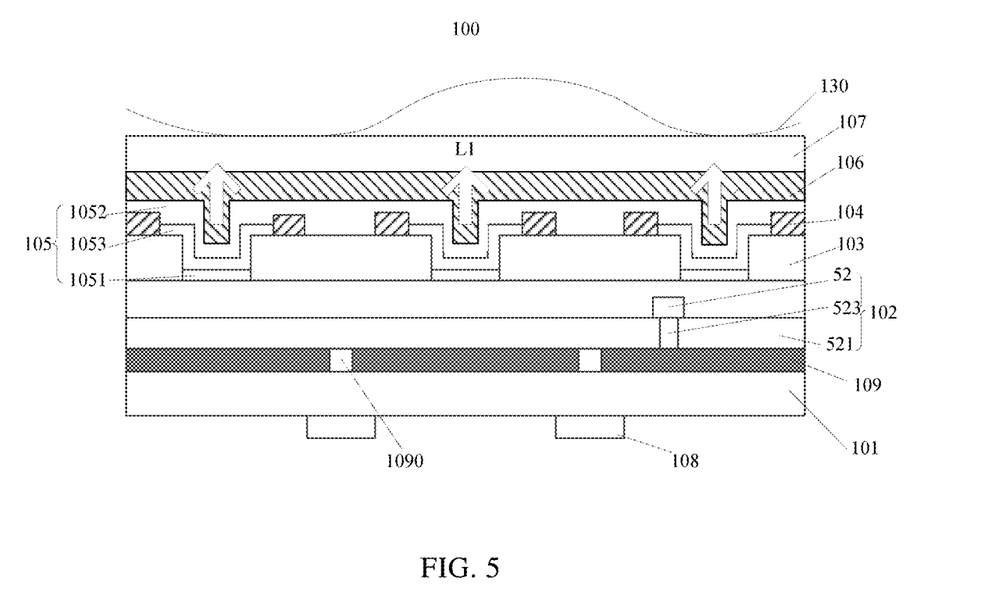
FIG. 5 is a schematic cross-sectional view of a display panel according to some embodiments of the present disclosure, which illustrates that a light shielding layer is electrically connected to a first potential signal line.
Figure 6:
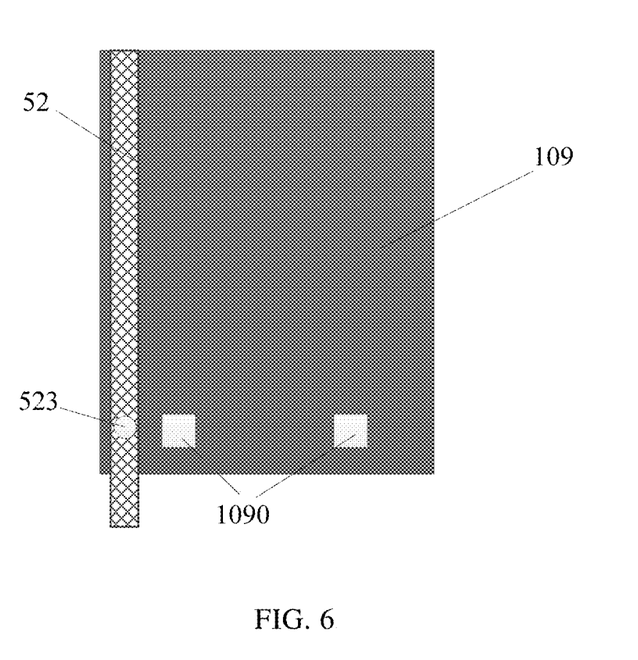
FIG. 6 is a plan view of a display panel according to some embodiments of the present disclosure, which illustrates that a light shielding layer is electrically connected to a first potential signal line.

For example, in the display panel according to some embodiments of the present disclosure, the light shielding layer 109 may be electrically connected to a first potential signal line 52, for example, the first potential signal line 52 may be an ELVDD power supply line (as shown in FIGS. 2A and 2B). That is, an ELVDD signal is supplied to the light shielding layer 109. Referring to FIGS. 5 and 6, the first potential signal line 52 may be located on a side of the light shielding layer 109 distal to the first substrate 101. For example, the first potential signal line 52 may be located in the pixel driving circuit layer 102. An insulating layer 521 (which may also be referred to as a first insulating layer) is disposed between the light shielding layer 109 and a layer where the first potential signal line 52 is located. The insulating layer 521 includes a via hole located therein, and a conductive material is deposited in the via hole to form an electrical connection member 523 (which may also be referred to as a first electrical connection member). As shown in FIG. 6, an orthographic projection of the electrical connection member 523 on the first substrate 101 falls within the orthographic projection of the light shielding layer 109 on the first substrate 101, the orthographic projection of the electrical connection member 523 on the first substrate 101 does not overlap with an orthographic projection of the light transmitting portion 1090 on the first substrate 101, and the orthographic projection of the electrical connection member 523 on the first substrate 101 overlaps with an orthographic projection of the first potential signal line 52 on the first substrate 101, in this way, the first potential signal line 52 is electrically connected to the light shielding layer 109 through the electrical connection member 523.

For example, when the driving transistor T1 is a P-type transistor, the first potential signal line 52 supplies the pixel driving circuit with a positive potential signal, for example, a potential signal of +5V, +8V or +10V. By means of the above-described electrical connection, the positive potential signal of designated potential is supplied to the light shielding layer 109. Therefore, the electric potential of the light shielding layer 109 may be stabilized at an operating voltage ELVDD of the pixel, thereby reducing the floating charges and their electrical influence on other circuits of the display panel. Meanwhile, the electric potential of the light shielding layer 109 may be not suspended, thereby stabilizing the output characteristic of the driving transistor. Thus, a kink effect presented on the output characteristic curve of the driving transistor, which is caused by the suspended potential of the light shielding layer 109, may be avoided. Further, by means of the above-described electrical connection, the light shielding layer 109 is connected in parallel with the power supply line of the pixel driving circuit, so that a resistance drop (that is, IR drop) of the operating voltage of the pixel driving circuit is reduced, and an overall power consumption of the display panel may be reduced.

Figure 7:
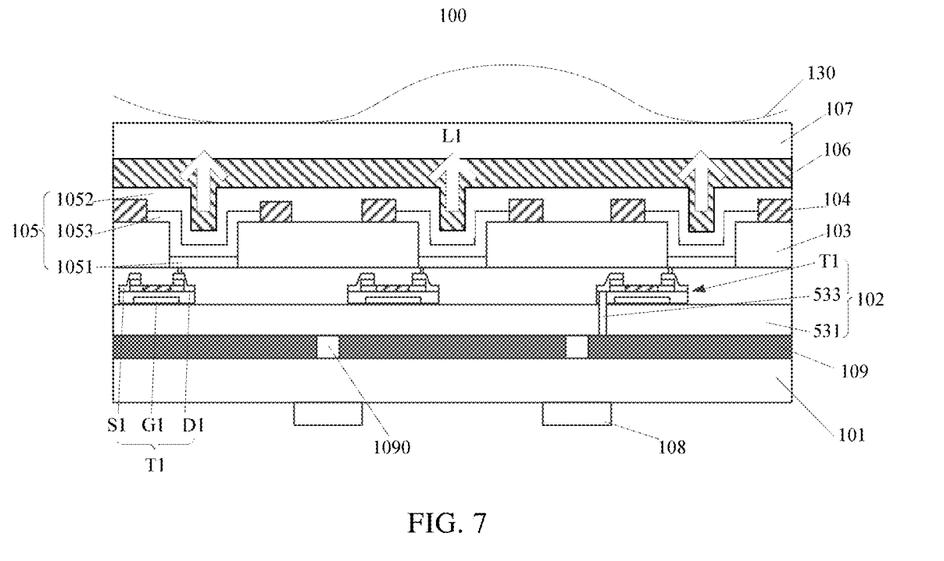
FIG. 7 is a schematic cross-sectional view of a display panel according to some embodiments of the present disclosure, which illustrates that a light shielding layer is electrically connected to a source electrode of a driving transistor.
Figure 8:
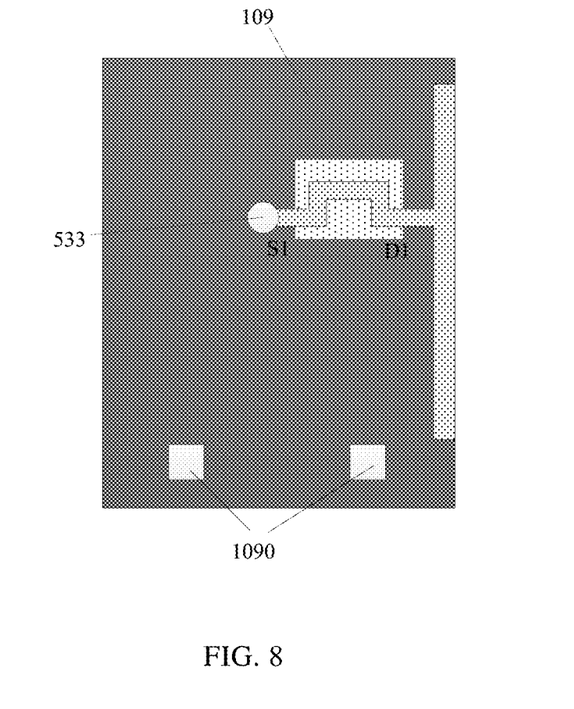
FIG. 8 is a plan view of a display panel according to some embodiments of the present disclosure, which illustrates that a light shielding layer is electrically connected to a source electrode of a driving transistor.

For example, in the display panel according to some embodiments of the present disclosure, the light shielding layer 109 may be electrically connected to the source electrode S1 (as shown in FIG. 2B) of the driving transistor T1 so that the light shielding layer is supplied with an operating voltage of the source electrode S1 of the driving transistor T1. Referring to FIGS. 7 and 8, the driving transistor T1 may include a gate electrode G1, a source electrode S1, and a drain electrode D1. The source electrode S1 may be located on a side of the light shielding layer 109 distal to the first substrate 101. For example, the source electrode S1 may be located in the pixel driving circuit layer 102. An orthographic projection of the source electrode S1 on the first substrate 101 may fall within the orthographic projection of the light shielding layer 109 on the first substrate 101. An insulating layer 531 (which may also be referred to as a second insulating layer) is disposed between the light shielding layer 109 and a layer where the source electrode S1 is located. The insulating layer 531 includes a via hole located therein, and a conductive material is deposited in the via hole to form an electrical connection member 533 (which may also be referred to as a second electrical connection member). As shown in FIG. 8, an orthographic projection of the electrical connection member 533 on the first substrate 101 falls within the orthographic projection of the light shielding layer 109 on the first substrate 101, the orthographic projection of the electrical connection member 533 on the first substrate 101 does not overlap with an orthographic projection of the light transmitting portion 1090 on the first substrate 101, and the orthographic projection of the electrical connection member 533 on the first substrate 101 overlaps with an orthographic projection of the source electrode S1 on the first substrate 101. In this way, the source electrode S1 is electrically connected to the light shielding layer 109 through the electrical connection member 533.

In this way, the light shielding layer 109 serves as a fourth end of the driving transistor and is connected to the operating voltage of the source electrode. For example, when the driving transistor T1 is a P-type transistor, the operating voltage of the source electrode S1 may be, for example, a positive potential signal of +5 V, and a positive potential signal of a designated potential is supplied to the light shielding layer 109 by means of the above-described electrical connection. Therefore, the electric potential of the light shielding layer 109 may be stabilized at the operating voltage of the source electrode, thereby reducing the floating charges and their electrical influence on other circuits of the display panel. Meanwhile, the electric potential of the light shielding layer 109 may be not suspended, thereby stabilizing the output characteristic of the driving transistor. Thus, a kink effect presented on the output characteristic curve of the driving transistor, which is caused by the suspended potential of the light shielding layer 109, may be avoided.

It should be noted that, for the sake of clarity, FIG. 7 only shows a structure of the driving transistor. In the illustrated embodiment, the driving transistor has a bottom-gate structure, but in other embodiments, the driving transistor may have a top-gate structure.

Figure 9:
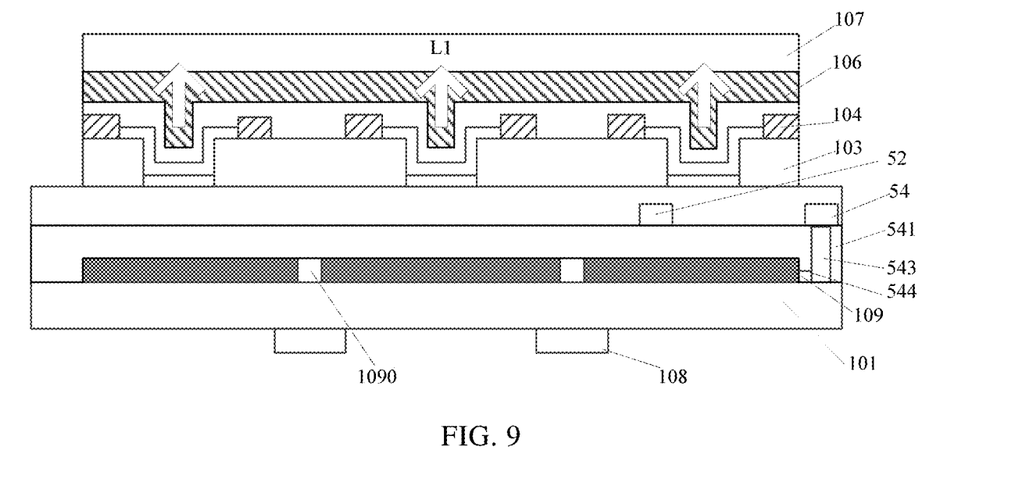
FIG. 9 is a schematic cross-sectional view of a display panel according to some embodiments of the present disclosure, which illustrates that a light shielding layer is electrically connected to a second potential signal line.
Figure 10:
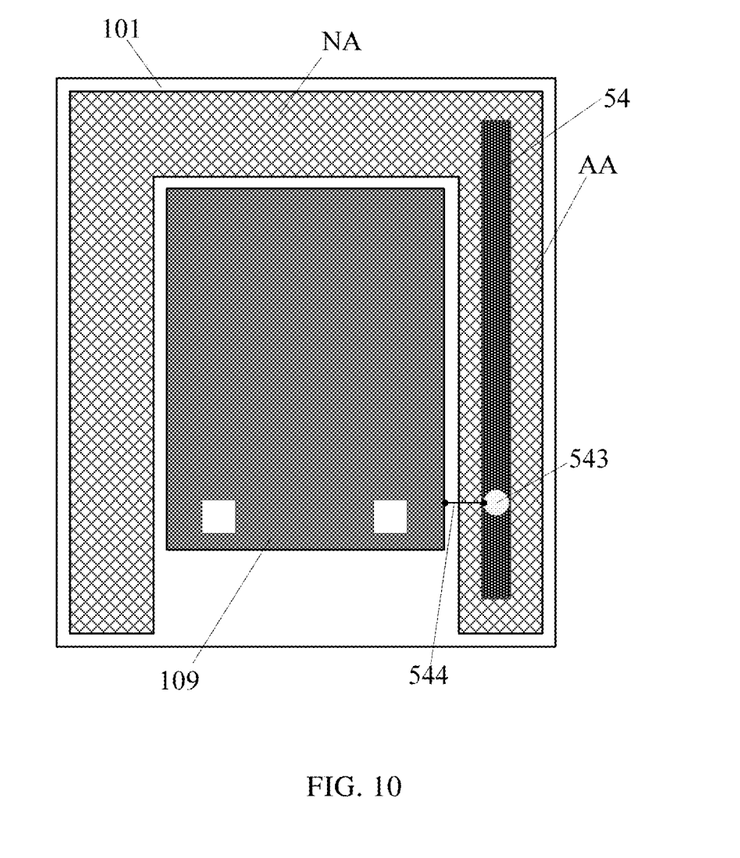
FIG. 10 is a plan view of a display panel according to some embodiments of the present disclosure, which illustrates that a light shielding layer is electrically connected to a second potential signal line.

For example, in the display panel according to some embodiments of the present disclosure, the light shielding layer 109 may be electrically connected to a second potential signal line 54, for example, the second potential signal line 54 may be an ELVSS power supply line (as shown in FIG. 2A and FIG. 2B). That is, an ELVSS signal is supplied to the light shielding layer 109. Referring to FIGS. 9 and 10, the second potential signal line 54 may be located on a side of the light shielding layer 109 distal to the first substrate 101. For example, the second potential signal line 54 may be located in the pixel driving circuit layer 102, and the second potential signal line 54 may be located in the same layer as the first potential signal line 52. An insulating layer 541 (which may also be referred to as a third insulating layer) is disposed between the light shielding layer 109 and a layer where the second potential signal line 54 is located. The insulating layer 541 includes a via hole located therein, and a conductive material is deposited in the via hole to form an electrical connection member 543 (which may also be referred to as a third electrical connection member). As shown in FIG. 10, an orthographic projection of the second potential signal line 54 on the first substrate 101 is located in the non-display area NA, and an orthographic projection of the electrical connection member 543 on the first substrate 101 is also located in the non-display area NA. In this case, the display panel 100 may further include an electrical connection line 544 (which may also be referred to as a second electrical connection line). In this way, the second potential signal line 54 is electrically connected to the light shielding layer 109 through both the electrical connection member 543 and the electrical connection line 544.

For example, when the driving transistor T1 is an N-type transistor, the second potential signal line 54 supplies the pixel driving circuit with a negative potential signal, for example, a potential signal of −5V, −8V or −10V. By means of the above-described electrical connection, the negative potential signal of a designated potential is supplied to the light shielding layer 109.

Therefore, the electric potential of the light shielding layer 109 may be stabilized at an operating voltage ELVSS of the pixel driving circuit, thereby reducing the floating charges and their electrical influence on other circuits of the display panel. Meanwhile, the electric potential of the light shielding layer 109 may be not suspended, thereby stabilizing the output characteristic of the driving transistor. Thus, a kink effect presented on the output characteristic curve of the driving transistor, which is caused by the suspended potential of the light shielding layer 109, may be avoided. Further, by means of the above-described electrical connection, the light shielding layer 109 is connected in parallel with the power supply line of the pixel driving circuit, so that a resistance drop (that is, IR drop) of the operating voltage of the pixel driving circuit is reduced, and an overall power consumption of the display panel may be reduced.

In the embodiments of the present disclosure, the light shielding layer 109 is electrically connected to a signal terminal for supplying the designated potential signal. For example, the signal terminal for supplying the designated potential signal may include at least one of the signal access terminal 51 located in the non-display area NA, the first potential signal line 52, the source electrode S1 of the driving transistor T1, or the second potential signal line 54. In this way, the floating charges and their electrical influence on other circuits of the display panel may be reduced. Meanwhile, the electric potential of the light shielding layer 109 may be not suspended, thereby stabilizing the output characteristic of the driving transistor. Thus, a kink effect presented on the output characteristic curve of the driving transistor, which is caused by the suspended potential of the light shielding layer 109, may be avoided. When the display panel according to some embodiments of the present disclosure is applied to a fingerprint recognition scene, the fingerprint recognition effect may be more stable, thus a high-pixel fingerprint recognition function is realized. In addition, in the embodiments of the present disclosure, the light shielding layer 109 is disposed in the display area AA, and the light shielding layer 109 is electrically connected to the signal terminal for supplying the designated potential signal, but the light shielding layer 109 does not overlap with the structures 30 such as the circuits, the wirings and the like located in the non-display area NA, so that a parasitic capacitance is not formed between the light shielding layer 109 and the structures 30 such as the circuits, the wirings and the like located in the non-display area NA, thereby facilitating to improving the display quality and the fingerprint recognition accuracy.

Figure 11:
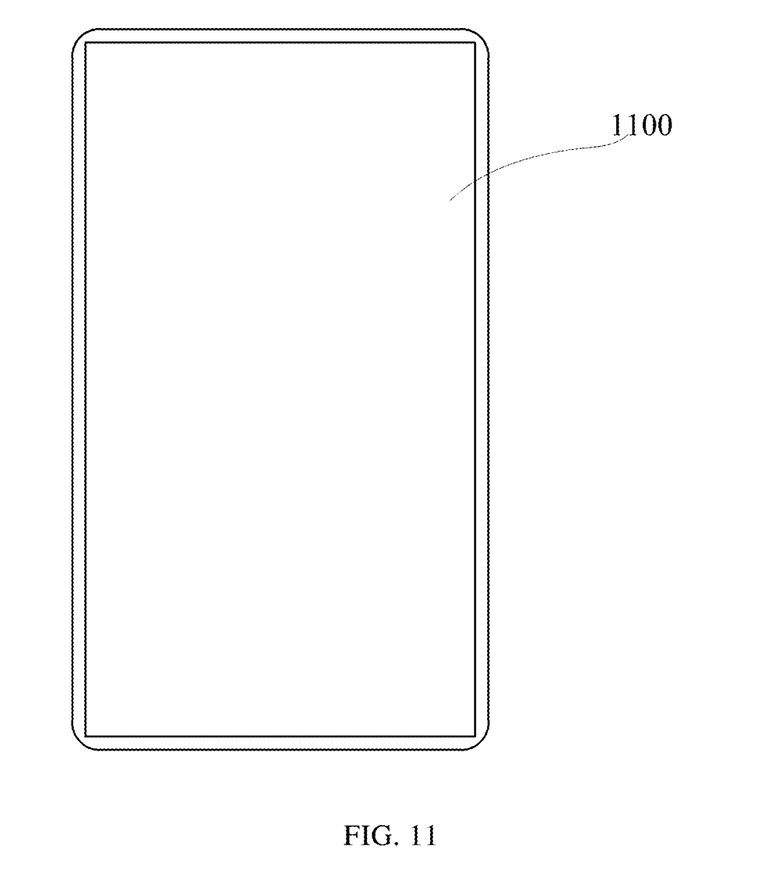
FIG. 11 is a plan view of a display apparatus according to some embodiments of the present disclosure.

According to some embodiments of the present disclosure, a display apparatus is also provided, as shown in FIG. 11, which illustrates a plan view of a display apparatus according to some embodiments of the present disclosure. The display apparatus 1100 may include the display panel according to some embodiments of the present disclosure. For example, the display apparatus according to some embodiments of the present disclosure may be any product or component having display function, such as a smart phone, a wearable smart watch, smart glasses, a tablet, a television, a display, a notebook computer, a digital photo frame, a navigator, an in-vehicle display, an e-book, or the like. Advantageously, the display apparatus according to some embodiments of the present disclosure may have all of the features and advantages of the display panel as described above, which are not repeated here again.

Figure 12:
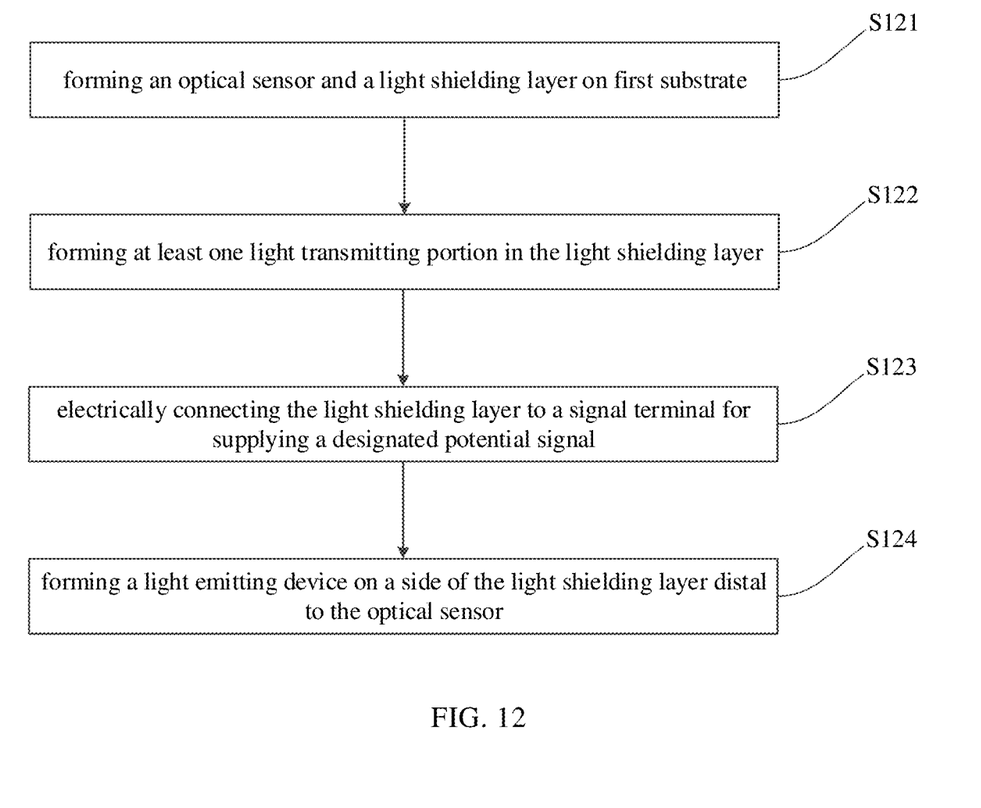
FIG. 12 is a flowchart of a method for manufacturing a display panel according to some embodiments of the present disclosure.

For example, some embodiments of the present disclosure further provide a method for manufacturing a display panel, and a schematic flowchart of the method is shown in FIG. 12. Specifically, the method may include the following steps.

In step S121, an optical sensor 108 and a light shielding layer 109 are formed on the first substrate 101.

In step S122, at least one light transmitting portion 1090 is formed in the light shielding layer 109. For example, a plurality of light transmitting portions 1090 may be formed in the light shielding layer 109, a plurality of optical sensors 108 may be formed on the first substrate 101, and positions of the plurality of light transmitting portions 1090 may be respectively in one-to-one correspondence with positions of the plurality of optical sensors 108, so that the plurality of optical sensors 108 may respectively receive the reflected light transmitted through the plurality of light transmitting portions 1090.

In step S123, the light shielding layer 109 is electrically connected to the signal terminal for supplying the designated potential signal. For example, the signal terminal for supplying the designated potential signal may include at least one of the signal access terminal 51 (PAD) located in the non-display area NA, the first potential signal line 52, the source electrode S1 of the driving transistor T1, or the second potential signal line 54.

In step S124, the light emitting device 105 is formed on the side of the light shielding layer 109 distal to the optical sensor 108.

In the above embodiments, the OLED display panel is taken as an example to describe the embodiments of the present disclosure in detail. Those skilled in the art should understand that the embodiments of the present disclosure are not limited to the OLED display panel and the OLED display apparatus, and may be applied to other electroluminescent display panel such as a QLED display panel.

While some embodiments according to a general inventive concept of the present disclosure have been shown and described, it will be understood by those skilled in the art that modifications and variations may be made to the embodiments without departing from the principle and spirit of the general inventive concept of the present disclosure. The scope of the disclosure is defined by the claims and their equivalents.

What is claimed is:

1. A display panel, comprising:
   a first substrate;
   a light emitting device on the first substrate, the light emitting device being configured to emit light;
   a light shielding layer on the first substrate, the light shielding layer being configured to shield light, which is emitted from the light emitting device and reflected by a touch body, from being transmitted through the light shielding layer; and
   at least one light transmitting portion in the light shielding layer, the light transmitting portion being configured to allow the light, which is emitted from the light emitting device and reflected by the touch body, to pass through the light transmitting portion and irradiate onto an optical sensor,
   wherein the light shielding layer is electrically connected to a signal terminal for supplying a designated potential signal;
   wherein the display panel further comprises a pixel driving circuit, the pixel driving circuit comprises a driving transistor, the light emitting device comprises a first electrode, a second electrode, and a light emitting layer between the first electrode and the second electrode, the driving transistor comprises a gate electrode, a source electrode and a drain electrode, the source electrode is electrically connected to a first potential signal line, and the drain electrode is electrically connected to the first electrode of the light emitting device, and the second electrode of the light emitting device is electrically connected to a second potential signal line; and
   wherein the signal terminal for supplying the designated potential signal comprises at least one of the first potential signal line, the source electrode of the driving transistor, or the second potential signal line.

2. The display panel of claim 1, wherein the display panel comprises a display area and a non-display area, the display panel further comprises a signal access terminal in the non-display area, and the signal terminal for supplying the designated potential signal comprises the signal access terminal.

3. The display panel of claim 2, wherein the signal access terminal supplies the designated potential signal, the signal access terminal is located in a same layer as the light shielding layer, and the light shielding layer is electrically connected to the signal access terminal through a first electrical connection line.

4. The display panel of claim 2, wherein an orthographic projection of the light shielding layer on the first substrate falls into the display area.

5. The display panel of claim 4, wherein an orthographic projection of a combination of the light shielding layer and the at least one light transmitting portion on the first substrate coincides with the display area.

6. The display panel of claim 1, wherein an orthographic projection of the first potential signal line on the first substrate overlaps with an orthographic projection of the light shielding layer on the first substrate, and the first potential signal line is located on a side of the light shielding layer distal to the first substrate.

7. The display panel of claim 6, wherein the display panel further comprises:
   a first insulating layer between the light shielding layer and a layer where the first potential signal line is located; and
   a first electrical connection member in the first insulating layer, and
   wherein the light shielding layer is electrically connected to the first potential signal line through the first electrical connection member.

8. The display panel of claim 7, wherein an orthographic projection of the first electrical connection member on the first substrate falls within the orthographic projection of the light shielding layer on the first substrate, and the orthographic projection of the first electrical connection member on the first substrate overlaps with the orthographic projection of the first potential signal line on the first substrate.

9. The display panel of claim 1, wherein an orthographic projection of the source electrode on the first substrate falls within an orthographic projection of the light shielding layer on the first substrate, and the source electrode is located on a side of the light shielding layer distal to the first substrate.

10. The display panel of claim 9, wherein the display panel further comprises:
    a second insulating layer between the light shielding layer and a layer where the source electrode is located; and
    a second electrical connection member in the second insulating layer, and
    wherein the light shielding layer is electrically connected to the source electrode through the second electrical connection member.

11. The display panel of claim 10, wherein an orthographic projection of the second electrical connection member on the first substrate falls within the orthographic projection of the light shielding layer on the first substrate, and the orthographic projection of the second electrical connection member on the first substrate overlaps with the orthographic projection of the source electrode on the first substrate.

12. The display panel of claim 1, wherein an orthographic projection of the second potential signal line on the first substrate does not overlap with an orthographic projection of the light shielding layer on the first substrate.

13. The display panel of claim 12, wherein the display panel further comprises:

a third insulating layer between the light shielding layer and a layer where the second potential signal line is located;

a third electrical connection member in the third insulating layer; and a second electrical connection line located in a same layer as the light shielding layer, and wherein the light shielding layer is electrically connected to the second potential signal line through both the third electrical connection member and the second electrical connection line.

14. The display panel of claim 1, wherein the first potential signal line and the second potential signal line are located in a same layer.

15. The display panel of claim 14, wherein the first potential signal line supplies an ELVDD signal, and the second potential signal line supplies an ELVSS signal.

16. The display panel of claim 1, wherein the light transmitting portion comprises a transparent material, or the light transmitting portion comprises a light transmitting hole.

17. The display panel of claim 1, further comprising at least one optical sensor, wherein the at least one optical sensor is disposed on a side of the light shielding layer distal to the light emitting device, and the at least one optical sensor is configured to receive the light passing through the light transmitting portion.

18. The display panel of claim 17, wherein the display panel comprises a plurality of light transmitting portions and a plurality of optical sensors, and orthographic projections of the plurality of light transmitting portions on the first substrate fall within orthographic projections of the plurality of optical sensors on the first substrate, respectively.

19. A display apparatus, comprising the display panel according to claim 1.

* * * * *